(12) United States Patent
Chu (10) Patent No.: US 6,707,324 B1
(45) Date of Patent: Mar. 16, 2004

(54) LOW GROUND BOUNCE OUTPUT DRIVER

(75) Inventor: Wei-shang Chu, San Jose, CA (US)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/299,830

(22) Filed: Nov. 20, 2002

(51) Int. Cl.⁷ ..................... H03B 1/00; H03K 19/0175; H03K 17/16
(52) U.S. Cl. .................... 327/108; 326/27; 326/82; 326/83
(58) Field of Search .............................. 326/22, 23–27, 326/82, 83, 86; 327/379, 380, 384, 387, 108, 110

(56) References Cited

U.S. PATENT DOCUMENTS

| | | | | |
|---|---|---|---|---|
| 4,880,997 A | * | 11/1989 | Steele | 326/27 |
| 5,877,638 A | * | 3/1999 | Lin | 327/108 |
| 6,043,702 A | * | 3/2000 | Singh | 327/534 |
| 6,459,325 B1 | * | 10/2002 | Hall et al. | 327/391 |

* cited by examiner

Primary Examiner—Tuan T. Lam
(74) Attorney, Agent, or Firm—Rabin & Berdo, P.C.

(57) ABSTRACT

An output driver with low ground bounce. The output driver receives a data signal and comprises a first transistor of a first type, having a drain connected to a pad, a source connected to receive a first power supply voltage and a gate, a capacitor with one end connected to receive the first power supply voltage and the other end connected to a charging/discharging node, a charging/discharging circuit generating a charging/discharging current output from the charging/discharging node when the data signal is at a first level, a first switch coupling the charging/discharging node to a second power supply voltage when the data signal is at a second level, and a second switch coupling the gate of the first transistor to the charging/discharging node when the data signal is at the first level and coupling the gate of the first transistor to receive the first power supply voltage when the data signal is at the second level.

37 Claims, 7 Drawing Sheets

LOW GROUND BOUNCE OUTPUT DRIVER

BACKGROUND OF THE INVENTION

1. Field of the Invention

The present invention relates to an output driver, particularly to an output driver with low ground bounce.

2. Description of the Prior Art

A CMOS digital output driver is a well known circuit that outputs a logic high or a logic low to a load capacitance by charging or discharging the load capacitance. In practice, several output drivers are often connected to the same ground (GND) line and the same power supply (VCC) line.

One of the problems associated with connecting several noisy (high di/dt) output drivers to the same ground line is that significant ground bounce (switching noise) can be generated when many (or all) of these output drivers discharge their load capacitances at the same time.

Figure 1:
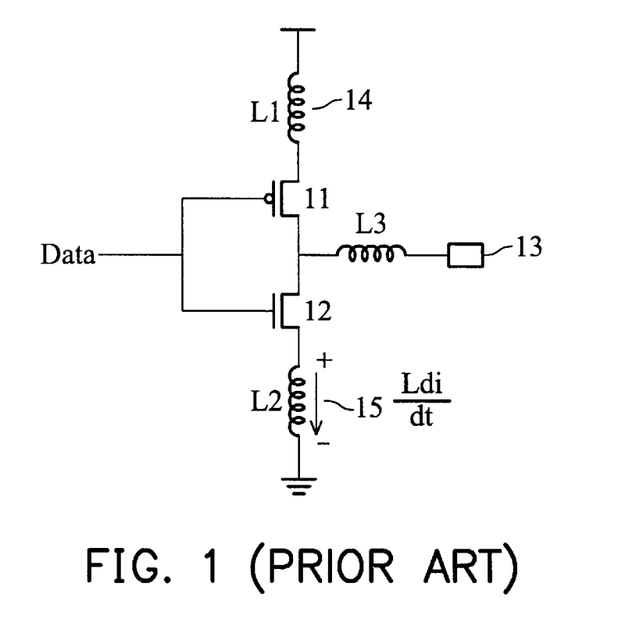
FIG. 1 is a diagram showing a basic output driver circuit.

FIG. 1 shows a circuit diagram that illustrates a basic output driver circuit. The driver circuit includes a p-channel transistor 11 and an n-channel transistor 12.

The p-channel transistor 11 has a source connected to a power supply VCC, a drain connected to an output pad 13, and a gate. The n-channel transistor 12 has a source connected to a ground, a drain connected to the drain of the p-channel transistor 11, and a gate.

During normal operation, when the output driver is switched from a logic high to a logic low, a time varying current $i_D(t)$ from the pad 13 flows through the n-channel transistor 12 to the ground. The time varying current $i_D(t)$ causes the voltage on the source of the n-channel transistor 12 to increase due to an inductance 15 of pins or bondwires connected to the ground. As shown in the equation 1, the voltage variation VLG on on the source of the n-channel transistor 12 is defined as follows:

$$VLG = L*(dihd\ D\ (t)/dt) \ldots \quad (1)$$

where L represents the inductance 15 and $di_D(t)/dt$ represents the time varying discharge current $i_D(t)$.

Thus, as shown in the equation 1, extremely high ground bounce (switching noise) can be generated when several drivers are switched from a logic high to a logic low at the same time.

Similarly, a significant power supply bounce (switching noise) can be generated when several noisy (high di/dt) output drivers charge their load capacitances from the same power supply line at the same time.

Thus, in view of the above, there is a need for an output driver that can minimize the ground bounce and power supply bounce that can occur when several high di/dt output drivers discharge or charge their load capacitances at the same time.

Additionally, a crossbar current which is the short circuit current during the transition time when both the n-channel and p-channel transistors are partially on contributes to a high di/dt.

Figure 2:
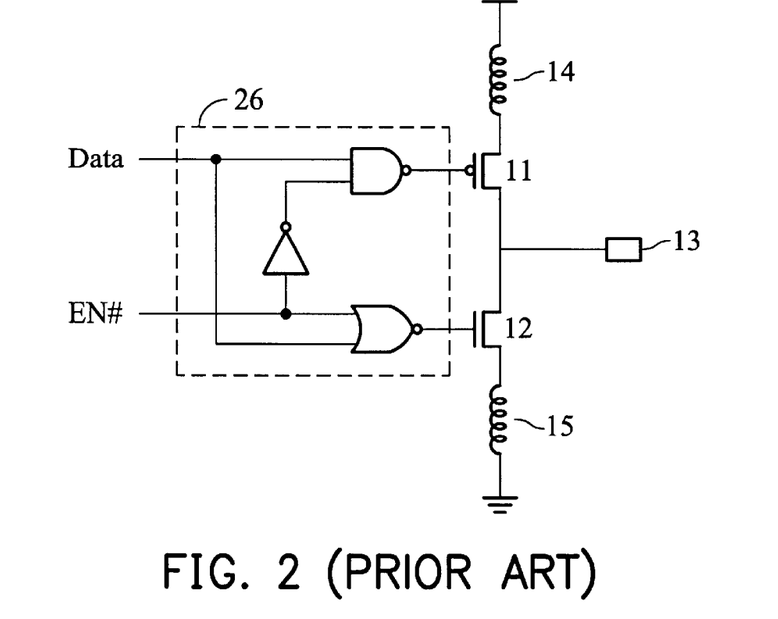
FIG. 2 is a diagram showing a conventional output driver circuit with a pre-driver.

FIG. 2 shows a prior art output driver circuit with a re-driver. The pre-driver performs waveform shaping to reduce the crossbar current.

The output driver circuit operates on output signals from a pre-driver circuit 26 comprising a NOR gate, a NAND gate and an inverter. The pre-driver circuit 26 turns off the p-channel transistor 12 faster when the n-channel transistor 11 is turned on. Similarly, The pre-driver circuit 26 turns off the n-channel transistor 11 faster when the p-channel transistor 12 is turned on. This reduces the transition time when both the n-channel and p-channel transistors are partially on as well as the crossbar current.

Figure 3:
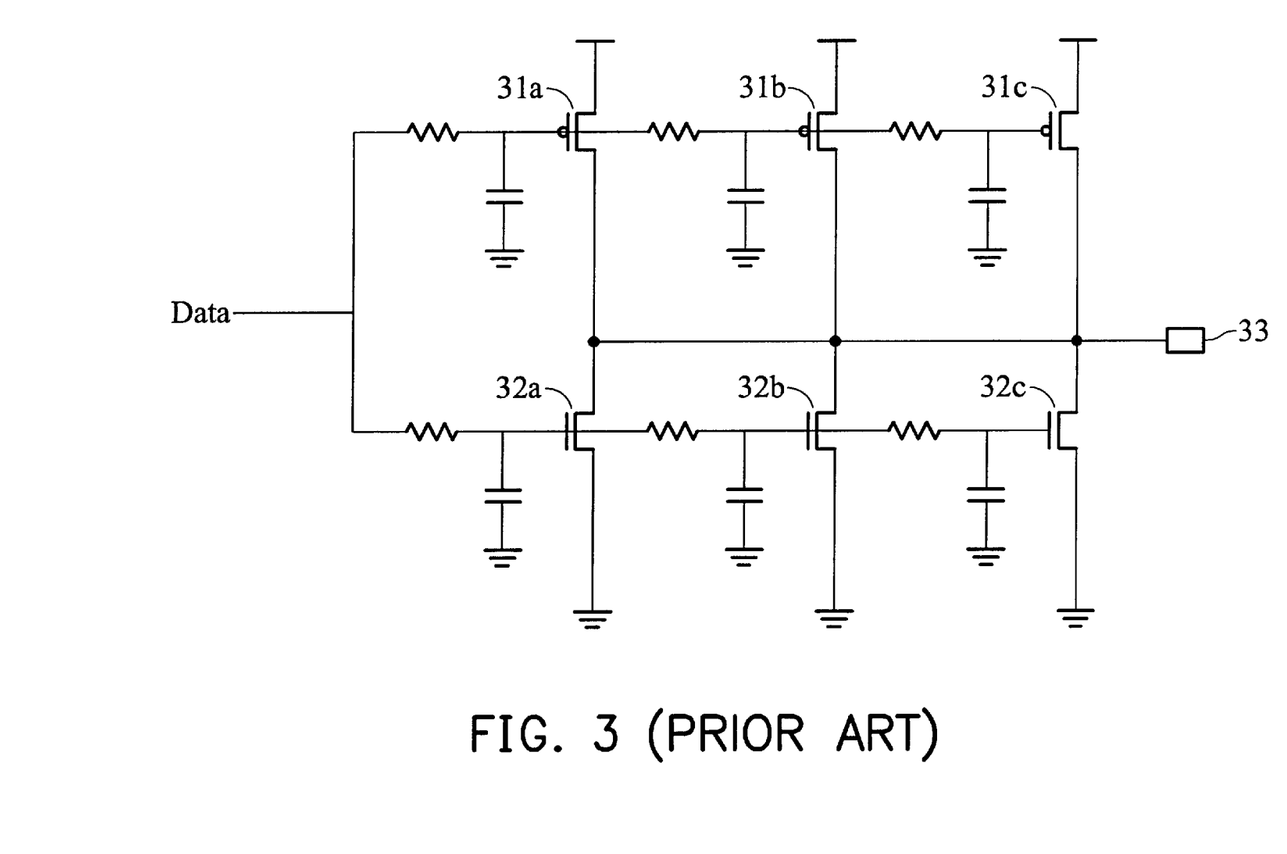
FIG. 3 is a diagram showing a conventional output driver circuit with RC delay circuits.

FIG. 3 is a diagram showing a prior art output driver circuit with RC delay circuits. The output driver circuit includes three parallel output drivers respectively composed of a p-channel transistor 31a and a n-channel transistor 32a, a p-channel transistor 31b and a n-channel transistor 32b, and a p-channel transistor 31c and a n-channel transistor 32c. Each of the transistors has an RC delay circuit connected to the gate. The RC delay circuits prevent the three output drivers being switched simultaneously. This minimizes the ground bounce and power supply bounce.

Figure 4:
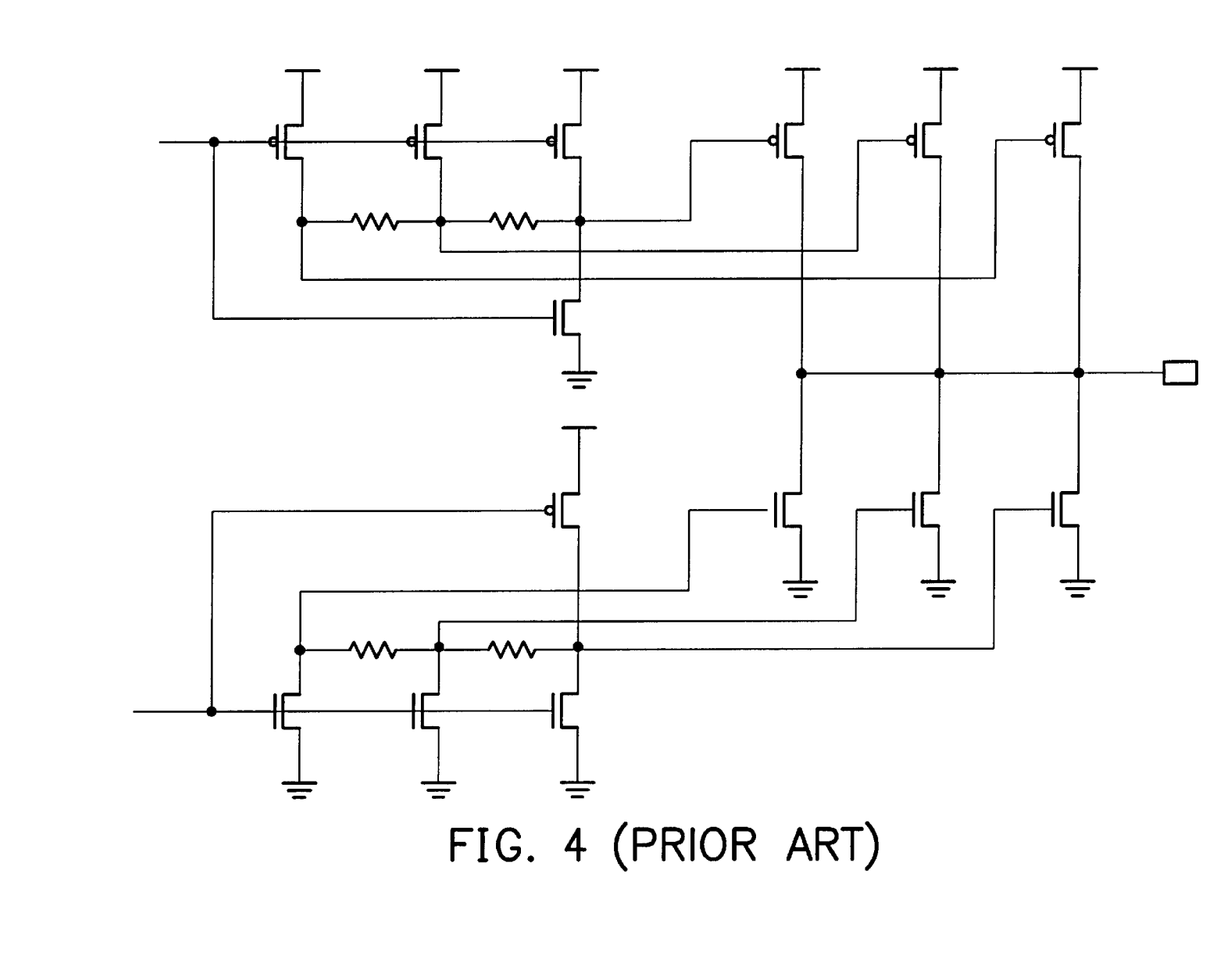
FIG. 4 is a diagram showing a conventional output driver circuit.

FIG. 4 is a diagram showing another prior art output driver circuit comprising multiple output drivers. The output driver circuit shown in FIG. 4 reduces the crossbar current and also prevents parallel output drivers being switched simultaneously.

SUMMARY OF THE INVENTION

The present invention provides an output driver with low ground bounce. The output driver receives a data signal and comprises a first transistor of a first type, having a drain connected to a pad, a source connected to receive a first power supply voltage and a gate, a capacitor with one end connected to receive the first power supply voltage and the other end connected to a charging/discharging node, a charging/discharging circuit generating a charging/discharging current output from the charging/discharging node when the data signal is at a first level, a first switch coupling the charging/discharging node to a second power supply voltage when the data signal is at a second level, and a second switch coupling the gate of the first transistor to the charging/discharging node when the data signal is at the first level and coupling the gate of the first transistor to receive the first power supply voltage when the data signal is at the second level.

The present invention further provides an output driver with low ground bounce receiving a data signal. The output driver comprises a first transistor of a first type, having a drain connected to a pad, a source connected to receive a first power supply voltage and a gate, a second transistor of a second type, having a drain connected to the pad, a source connected to receive a second power supply voltage and a gate, a first capacitor with one end connected to receive the first power supply voltage and the other end connected to a charging node, a second capacitor with one end connected to receive the second power supply voltage and the other end connected to a discharging node, a charging circuit generating a charging current output from the charging node when the data signal is at a first level, a discharging circuit generating a discharging current output from the discharging node when the data signal is at a second level, a first switch coupling the charging node to the second power supply voltage when the data signal is at the second level, a second switch coupling the discharging node to the first power supply voltage when the data signal is at the first level, a third switch coupling the gate of the first transistor to the charging node when the data signal is at the first level and coupling the gate of the first transistor to receive the first power supply voltage when the data signal is at the second level, and a fourth switch coupling the gate of the second transistor to the discharging node when the data signal is at the second level and coupling the gate of the second transistor to receive the second power supply voltage when the data signal is at the first level.

The present invention also provides an output driver for processing a data signal, comprising: a charging/discharging circuit for generating a charging/discharging current output signal on an output node when the voltage level of the data signal is at a first level, a first transistor of a first type, having a drain connected to a pad, a source connected to a ground voltage for receiving a first power supply voltage and a gate, a first switch coupling the output node of the charging/discharging circuit to a charging/discharging node when the voltage level of the data signal is at the first level, and coupling the output node to a second power supply voltage when the voltage level of the data signal is at a second level; and, a second switch coupling the gate of the first transistor to the output node when the data signal is at the first level and coupling the gate of the first transistor to receive the first power supply voltage when the data signal is at the second level.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 5A:
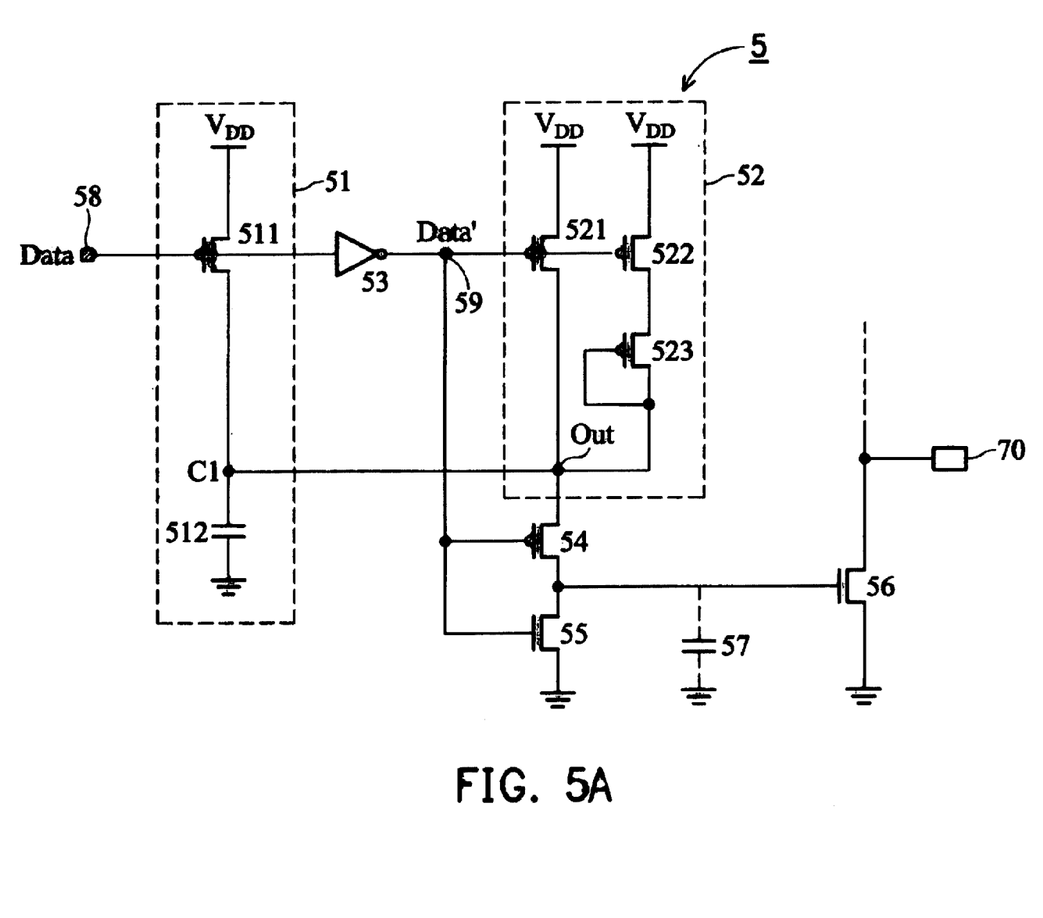
FIG. 5A is a diagram showing an output driver circuit according to a first embodiment of the invention.

FIG. 5A is a diagram showing an output driver circuit according to a first embodiment of the invention. As shown in FIG. 5, an output driver 5 receives a data signal at data input pad 58, and then outputs to a data output pad 70. The output driver 5 comprises a N-type (channel) pull-down transistor 56, a capacitor 512, a charging circuit 52, a switch composed of a P-type (channel) transistor 511, another switch composed of transistors 54 and 55, and an inverter 53. A waveform shaping circuit 51 as shown in FIG. 5 includes a P-type (channel) transistor 511 and a capacitor 512. The capacitor 512 has its one end connected to the ground and has the other end connected to a charging node C1.

The charging circuit 52 includes 3 P-type transistors 521, 522, and 523. The charging circuit 52 can generate a charging current in response to the output signal of the charging node C1 when the data input signal DATA is at a high logic level. The switch 511 is turned on when the data input signal DATA is at a low logic level.

The switch device composed of the transistors 54 and 55 couples the gate of the transistor 56 to the charging node C1 when the data signal DATA is at the high logic level and couples the gate of the transistor 56 to receive the ground voltage when the data signal DATA is at the low logic level. The inverter 53 receives and inverts the data input signal DATA. The P-type (channel) transistor 511 has its source connected to a power supply voltage VDD, has its drain connected to the charging node C1 and has its gate connected to the data input pad 58. The transistor 56 has a parasitic capacitor 57 between its gate and its source. The transistor 56 has its drain connected to the data output pad 70, has its source connected to a ground and has its gate connected to the capacitor 57.

The P-type (channel) transistor 54 has its source connected to the charging node C1, has its drain connected to the gate of the transistor 56 and has its gate connected to the gate of transistor 55 and the terminal 59 for receiving the inverted data signal DATA'. The N-type (channel) transistor 55 has its drain connected to the ground, has its source connected to the drain of transistor 54 and has its gate connected to the gate of transistor 54 and the pad 59 for receiving the inverted data signal DATA'.

The charging circuit 52 comprises 3 P-type (channel) transistors 521, 522 and 523. The transistor 521 has its drain connected to the charging node C1, has its source connected to the power supply voltage VDD and has its gate connected to pad 59 for receiving the inverted data signal DATA'. The transistor 522 has its source connected to the power supply voltage VDD, has its gate connected to the bulk of transistor 521 and has its drain connected to the source of the transistor 523. The transistor 523 has its source connected to the drain of the transistor 522, and has both its drain and its gate connected to the charging node C1.

When the data input signal DATA is at the low logic level, the transistors of the charging circuit 52 and the transistor 54 are turned off, and the transistor 55 is turned on. The gate-to-source voltage of the transistor 56 is fast reduced below the threshold voltage by current discharging through an RC circuit composed of the parasitic capacitor 57 and an on-resistance of the transistor 55. Thus, the transistor 56 is quickly turned off.

When the data signal DATA is at the high logic level, the transistors of the charging circuit 52 and the transistor 54 are turned on, and the transistors 511 and 55 are turned off. The charging current is generated by the charging circuit 52 and output to the charging node C1, and through an RC circuit composed of the capacitors 512, 57 and an on-resistance of the transistor 54, the gate-to-source voltage of the transistor 56 is increased fast above the threshold voltage. Thus, the transistor 56 is fast turned on.

Figure 5B:
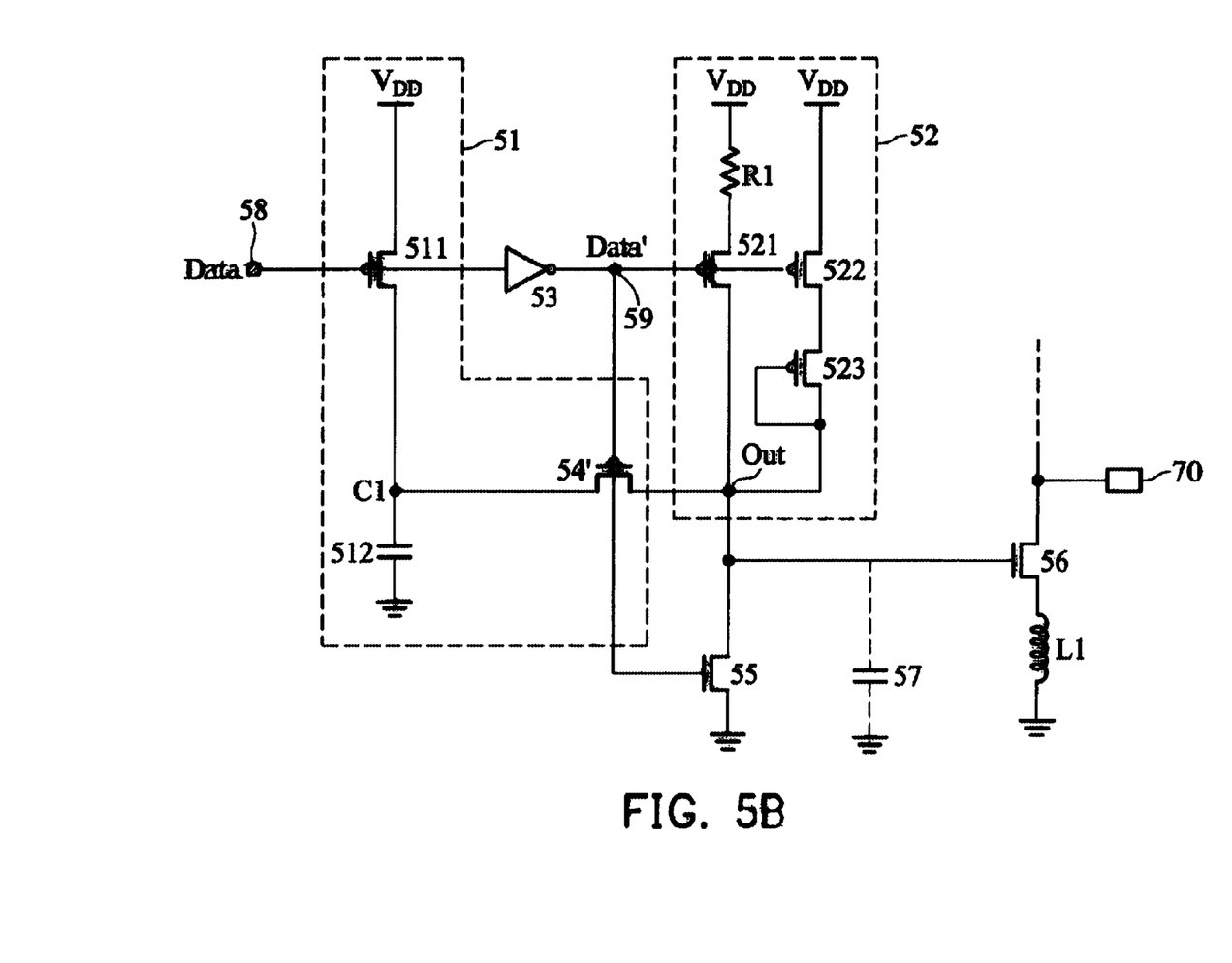
FIG. 5B is a diagram showing an output driver circuit according to a second embodiment of the invention.

FIG. 5B is a diagram showing an output driver circuit according to a second embodiment of the invention. It is similar to the circuit shown in FIG. 5A except that the transistor 54 is eliminated and replaced by a transistor 54' having gate receiving the inverted data signal, a drain and source coupled to an output node of the charging/discharging circuit 52 and the node C1. Further, a resistor R1 is coupled to the source of the transistor 522 and an inductor L1 is coupled to the source of the transistor 56. The circuit shown in FIG. 5B works the same as that shown in FIG. 5A.

It is noted that, in FIG. 5A or 5B, a switch circuit is composed of the transistors 511, 54 or 54', and 55, and the inverter 53. The switch circuit couples the output node OUT of the charging circuit 52 and the gate of the transistor 56 commonly to the charging node C1 when the voltage level of the data signal is logic high, and couples the charging node C1 and the gate of the transistor 56 respectively to VDD and the ground when the voltage level of the data signal is logic low.

Figure 6:
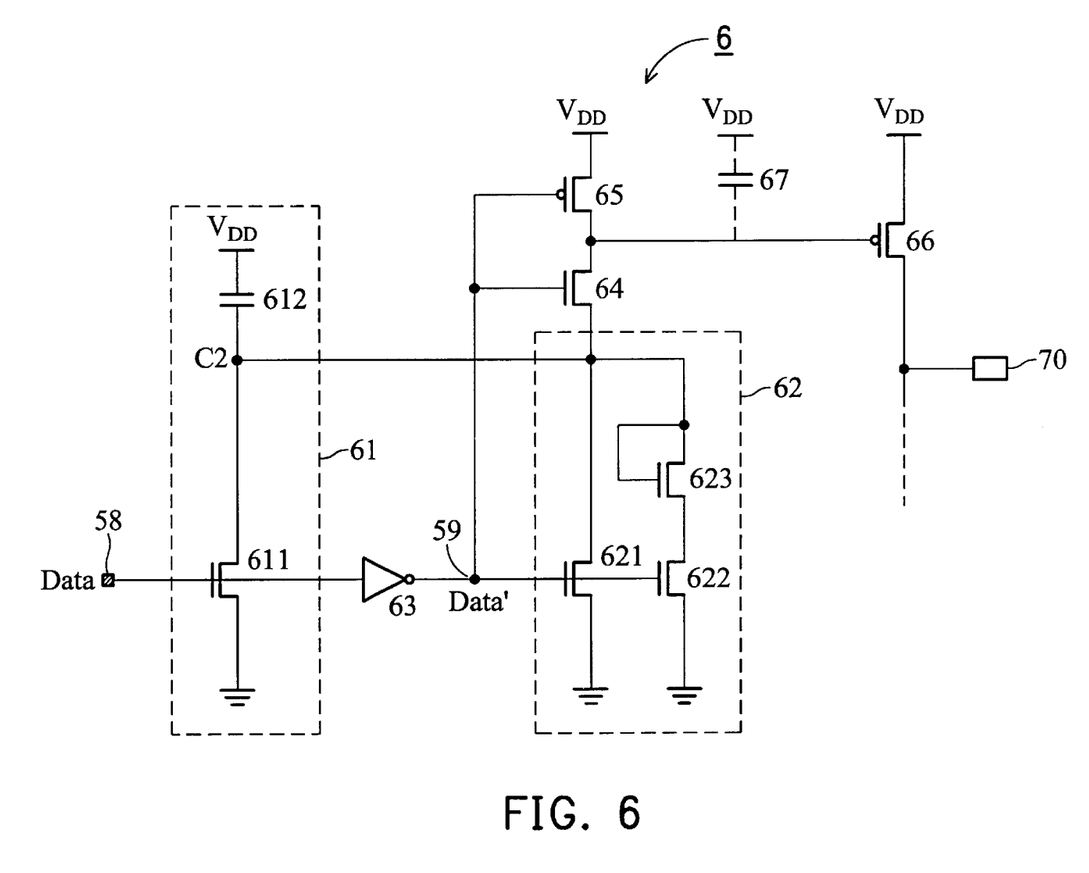
FIG. 6 is a diagram showing an output driver circuit according to a third embodiment of the invention.

FIG. 6 is a diagram showing an output driver circuit according to a third embodiment of the invention. The output driver 6 comprises a pull-up P-type (channel) transistor 66 with a drain connected to the output data pad 70, a source connected the power supply voltage VDD, as shown in FIG. 6. The output driver 6 includes a capacitor 612, a charging circuit 62, a first switch device composed of a N-type (channel) transistor 611, a second switch composed of transistors 64 and 65, and an inverter 63. The waveform shaping circuit 61 includes a N-type (channel) transistor 611 and capacitor 621 as shown in FIG. 6. The capacitor 612 has one end connected to the power supply voltage VDD and the other end connected to a charging node C2. A charging current is generated by the charging circuit 62 and output to the charging node C2 when the input data signal DATA is at the low logic level.

The switch 611 is turned on when the data signal DATA is at the high logic level. The switch device composed of the transistors 64 and 65 couples the gate of the transistor 66 to the charging node C2 when the data signal DATA is at the low logic level and couples the gate of the transistor 66 to receive the power supply voltage VDD when the data signal DATA is at the high logic level. The inverter 63 receives and inverts the data signal DATA. The N-type (channel) transistor 611 has a source connected to receive the ground voltage, a drain connected to the charging node C2 and a gate connected to receive the data signal. The transistor 66 has a parasitic capacitor 67 between the gate and source.

The N-type (channel) transistor 64 has a source connected to the charging node C2, a drain connected to the gate of the transistor 66 and a gate connected to receive the inverted data signal DATA'. The P-type (channel) transistor 65 has a drain connected to the gate of the transistor 66, a source connected to receive the power supply voltage VDD and a gate connected to receive the inverted data signal DATA'.

The charging circuit 62 comprises N-type (channel) transistors 621, 622 and 623. The transistor 621 has a drain connected to the charging node C2, a source connected to receive the ground voltage and a gate connected to receive the inverted data signal DATA'. The transistor 622 has a source connected to receive the ground voltage, a gate connected to receive the inverted data signal DATA' and a drain. The transistor 623 has a source connected to the drain of the transistor 622, and a drain and gate both connected to the charging node C2.

When the data signal DATA is at the high logic level, the charging circuit 62 and the transistor 64 are turned off, and the transistor 65 is turned on. The source-to-gate voltage of the transistor 66 is quickly reduced to below the threshold voltage by current charging through an RC circuit composed of the parasitic capacitor 67 and an on-resistance of the transistor 65. Thus, the transistor 66 is quickly turned off. When the data signal DATA is at the low logic level, the discharging circuit 62 and the transistor 64 are turned on, and the transistors 611 and 65 are turned off. By the discharging current generated by the discharging circuit 62 from the discharging node C2, and through an RC circuit composed of the capacitors 612, 67 and an on-resistance of the transistor 64, the source-to-gate voltage of the transistor 66 is fast increased above the threshold voltage. Thus, the transistor 66 is fast turned on.

Figure 7:
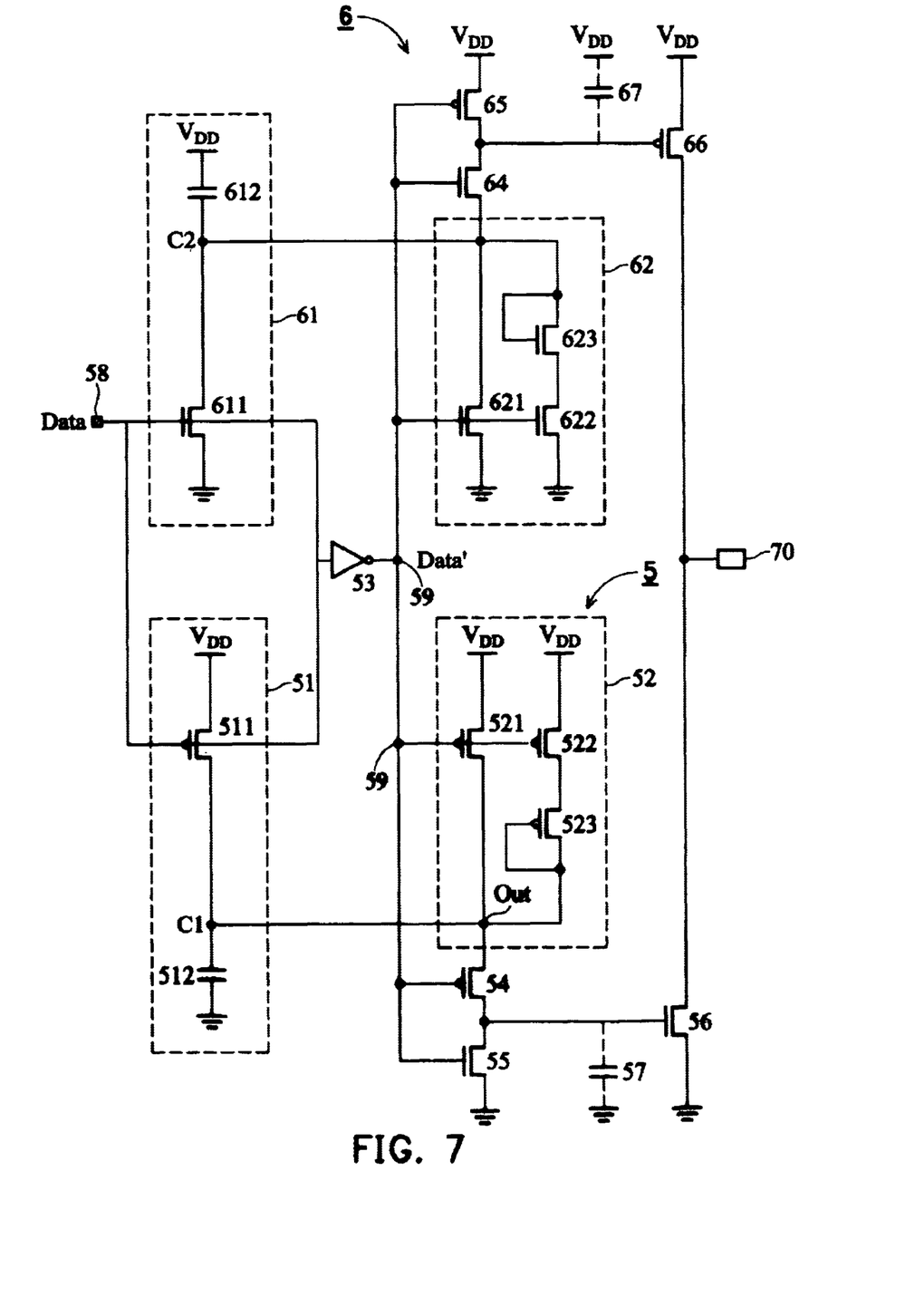
FIG. 7 is a diagram showing an output driver circuit according to a fourth embodiment of the invention.

Alternatively, those skilled in the art will appreciate that an output driver circuit may include both of the circuits shown in FIG. 5A and 6, wherein both circuits share one inverter 53 and are connected to the same pad 70, as shown FIG. 7. Referring to FIG. 7, the lower half of the circuit illustrated, including the inverter 53 and pad 70, is the same as the circuit shown in FIG. 5A.

In FIG. 7, the illustrated output driver for receiving a data signal DATA includes an n-type transistor 56, having its drain connected to the pad 70, source connected to receive a ground voltage and a gate. A p-type transistor 66 has its drain connected to the pad 70, its source connected to receive a power supply voltage VDD, and a gate. Capacitor 512 has one end connected to ground and the other end connected to a charging node C1. Capacitor 612 has one end connected to receive the power supply voltage VDD and the other end connected to a discharging node C2. A charging circuit 52 generates a charging current output from the charging node C1 when the data signal DATA is at a high level (is high). A discharging circuit 62 generates a discharging current output from the discharging node C2 when the data signal DATA is at a low level (is low). A first switch 511, a p-type transistor, couples the charging node C1 to the power supply voltage VDD when the data signal DATA is low. A second switch 611, an n-type transistor, couples the discharging node C2 to ground when the data signal DATA is high. A third switch, in the form of a p-type transistor 54 and an n-type transistor 55, couples the gate of the n-type transistor 56 to the charging node C1 when the data signal DATA is high, and couples the gate of the n-type transistor 56 to ground when the data signal DATA is low. A fourth switch, in the form of an n-type transistor 64 and a p-type transistor 65, couples the gate of the p-type transistor 66 to the discharging node C2 when the data signal DATA is low, and couples the gate of the p-type transistor 66 to receive the power supply voltage VDD when the data signal DATA is high.

The first switch 511 includes a p-type transistor, having a source connected to receive the power supply voltage $V_{DD}$, a drain connected to the charging node C1 and a gate connected to receive the data signal DATA. The second switch 611 includes an n-type transistor, having a source connected to ground, a drain connected to the discharging node C2 and a gate connected to receive the data signal DATA. An inverter 53 receives and inverts the data signal DATA. The third switch includes a p-type transistor 54, having a source connected to the charging node C1, a drain connected to the gate of the n-type transistor 56, and a gate connected to receive the inverted data signal DATA'. The third switch further includes an n-type transistor 55, having a drain connected to the gate of the n-type transistor 56, a source connected to ground and a gate connected to receive the inverted data signal DATA'.

The fourth switch includes an n-type transistor 64, having a source connected to the discharging node C2, a drain connected to the gate of the p-type transistor 66 and a gate connected to receive the inverted data signal DATA'. The fourth switch further includes a p-type transistor 65, having a drain connected to the gate of the p-type transistor 66, a source connected to receive the power supply voltage $V_{DD}$ and a gate connected to receive the inverted data signal DATA'.

The charging circuit 52 includes a p-type transistor 521 having a drain connected to the charging node C1, a source connected to ground and a gate connected to receive the inverted data signal DATA'. The charging circuit 52 also includes a p-type transistor 522 having a source connected to receive the power supply voltage $V_{DD}$, a gate connected to receive the inverted data signal DATA' and a drain. The charging circuit additionally includes a p-type transistor 523 having a source connected to the drain of the p-type transistor 522, and a drain and gate both connected to the charging node C1. The discharging circuit 62 includes an n-type transistor 621 having a drain connected to the discharging node C2, a source connected to ground and a gate connected to receive the inverted data signal DATA'. The discharging circuit also includes an n-type transistor 622 having a source connected to ground, a gate connected to receive the inverted data signal DATA' and a drain. The discharging circuit 62 further includes an n-type transistor 623 having a source connected to the drain of the transistor 622, and a drain and gate both connected to the discharging node C2.

In conclusion, the output driver of the present invention includes a variable impedance charging/discharging source. This speeds up the change of the gate voltage of the pull-up or pull-down transistor. The pull-up and pull-down transistors are quickly turned off when the data signal is switched from high to low or from low to high logic level. This avoids a high di/dt and noise generated therefrom.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An output driver for processing a data signal, comprising:

a charging/discharging circuit for generating a charging/discharging current output signal to a charging/discharging node when the voltage level of the data signal is at a first level;

first transistor of a first type, having a drain connected to a pad, a source connected to receive a first power supply voltage, and a gate;

a first switch coupling the charging/discharging node to a second power supply voltage when the voltage level of the data signal is at a second level; and a second switch coupling the gate of the first transistor to the charging/discharging node when the data signal is at the first level and coupling the gate of the first transistor to receive the first power supply voltage when the data signal is at the second level.

2. The output driver as claimed in claim 1 further comprising a capacitor with one end connected to the gate of the first transistor and the other end connected to receive the first power supply voltage.

3. The output driver as claimed in claim 1, wherein the first switch comprises a second transistor of a second type, having a source connected to receive the second power supply voltage, a drain connected to the charging/discharging node and a gate connected to receive the data signal.

4. The output driver as claimed in claim 3, wherein the first and second types are N and P type, respectively, the first and second power supply voltage are a ground and VDD voltage respectively, and the first and second level is a high and low logic level respectively.

5. The output driver as claimed in claim 3, wherein the first and second types are P and N type, respectively, the first and second power supply voltages are a VDD and ground voltage respectively, and the first and second levels are a low and high logic level respectively.

6. The output driver as claimed in claim 1 further comprising an inverter receiving and inverting the data signal.

7. The output driver as claimed in claim 6, wherein the second switch comprises:

a third transistor of a second type, having a source connected to the charging/discharging node, a drain connected to the gate of the first transistor and a gate connected to receive the inverted data signal; and a fourth transistor of the first type, having a drain connected to the gate of the first transistor, a source connected to receive the first power supply voltage, and a gate connected to receive the inverted data signal.

8. The output driver as claimed in claim 7, wherein the first and second types are N and P type, respectively, the first and second power supply voltages are a ground and VDD voltage respectively, and the first and second levels are a high and low logic level respectively.

9. The output driver as claimed in claim 7, wherein the first and second types are P and N type, respectively, the first and second power supply voltages are a VDD and ground voltage, respectively, and the first and second levels are a low and high logic level, respectively.

10. The output driver as claimed in claim 6, wherein the charging/discharging circuit comprises:

a fifth transistor of a second type, having a drain connected to the charging/discharging node, a source connected to receive the second power supply voltage and a gate connected to receive the inverted data signal;

a sixth transistor of the second type, having a source connected to receive the second power supply voltage, a gate connected to receive the inverted data signal and a drain; and a seventh transistor of the second type, having a source connected to the drain of the sixth transistor, and a drain and gate both connected to the charging/discharging node.

11. The output driver as claimed in claim 10, wherein the first and second type is N and P type respectively, the first and second power supply voltage are a ground and VDD voltage respectively, and the first and second level is a high and low logic level respectively.

12. The output driver as claimed in claim 10, wherein the first and second types are P and N type, respectively, the first and second power supply voltages are a VDD and ground voltage, respectively, and the first and second levels are a low and high logic level, respectively.

13. The output driver as claimed in claim 1, wherein the first transistor has a parasitic capacitor between the gate and source.

14. An output driver for receiving a data signal, comprising:

a first transistor of a first type, having a drain connected to a pad, a source connected to receive a first power supply voltage, and a gate;

a second transistor of a second type, having a drain connected to the pad, a source connected to receive a second power supply voltage and a gate;

a first capacitor with one end connected to receive the first power supply voltage and the other end connected to a charging node;

a second capacitor with one end connected to receive the second power supply voltage and the other end connected to a discharging node;

a charging circuit generating a charging current output from the charging node when the data signal is at a first level;

a discharging circuit generating a discharging current output from the discharging node when the data signal is at a second level;

a first switch coupling the charging node to the second power supply voltage when the data signal is at the second level;

a second switch coupling the discharging node to the first power supply voltage when the data signal is at the first level;

a third switch coupling the gate of the first transistor to the charging node when the data signal is at the first level and coupling the gate of the first transistor to receive the first power supply voltage when the data signal is at the second level; and a fourth switch coupling the gate of the second transistor to the discharging node when the data signal is at the second level and coupling the gate of the second transistor to receive the second power supply voltage when the data signal is at the first level.

15. The output driver as claimed in claim 14, wherein the first switch comprises a third transistor of the second type, having a source connected to receive the second power supply voltage, a drain connected to the charging node and a gate connected to receive the data signal, and the second switch comprises a fourth transistor of the first type, having a source connected to receive the first power supply voltage, a drain connected to the discharging node and a gate connected to receive the data signal.

16. The output driver as claimed in claim 14 further comprising an inverter receiving and inverting the data signal.

17. The output driver as claimed in claim 16, wherein the third switch comprises:

a fifth transistor of the second type, having a source connected to the charging node, a drain connected to the gate of the first transistor and a gate connected to receive the inverted data signal; and a sixth transistor of the first type, having a drain connected to the gate of the first transistor, a source connected to receive the first power supply voltage and a gate connected to receive the inverted data signal.

18. The output driver as claimed in claim 16, wherein the fourth switch comprises:

a seventh transistor of the first type, having a source connected to the discharging node, a drain connected to the gate of the second transistor and a gate connected to receive the inverted data signal; and an eighth transistor of the second type, having a drain connected to the gate of the second transistor, a source connected to receive the second power supply voltage and a gate connected to receive the inverted data signal.

19. The output driver as claimed in claim 16, wherein the charging circuit comprises:

a ninth transistor of the second type, having a drain connected to the charging node, a source connected to receive the second power supply voltage and a gate connected to receive the inverted data signal;

a tenth transistor of the second type, having a source connected to receive the second power supply voltage, a gate connected to receive the inverted data signal and a drain; and an eleventh transistor of the second type, having a source connected to the drain of the tenth transistor, and a drain and gate both connected to the charging node.

20. The output driver as claimed in claim 16, wherein the discharging circuit comprises:

a twelfth transistor of the first type, having a drain connected to the discharging node, a source connected to receive the first power supply voltage and a gate connected to receive the inverted data signal;

a thirteenth transistor of the first type, having a source connected to receive the first power supply voltage, a gate connected to receive the inverted data signal and a drain; and a fourteenth transistor of the first type, having a source connected to the drain of the thirteenth transistor, and a drain and gate both connected to the discharging node.

21. The output driver as claimed in claim 14, wherein the first and second types are N and P type, respectively, the first and second power supply voltages are a ground and VDD voltage, respectively, and the first and second levels are a high and low logic level, respectively.

22. An output driver for processing a data signal, comprising:

a charging/discharging circuit for generating a charging/discharging current output signal on an output node when the voltage level of the data signal is at a first level;

a first transistor of a first type, having a drain connected to a pad, a source connected to receive a first power supply voltage, and a gate; and a switch circuit coupling the output node of the charging/discharging circuit and the gate of the first transistor commonly to a charging/discharging node when the voltage level of the data signal is at the first level, and coupling the charging/dicharging node and the gate of the first train to respectively to a second and the first power supply voltage when the voltage level of the data signal is at a second level.

23. The output driver as claimed in claim 22 further comprising a capacitor with one end connected to the gate of the first transistor and the other end connected receive the first power supply voltage.

24. The output driver as claimed in claim 22, wherein the first switch circuit comprises:

an inverter receiving and inverting the data signal;

a second transistor of a second type, having a source connected to the charging/discharging node, a drain connected to the output node, and a gate connected to receive the inverted data signal;

a third transistor of the first type, having a drain connected to the gate of the first transistor, a source connected to receive the first power supply voltage, and a gate connected to receive the inverted data signal; and a fourth transistor of the second type, having a source connected to receive the second power supply voltage, a drain connected to the charging/discharging node, and a gate connected to receive the data signal.

25. The output driver as claimed in claim 24, wherein the first and second types are N and P type, respectively, the first and second power supply voltage are a ground and VDD voltage respectively, and the first and second level is a high and low logic level respectively.

26. The output driver as claimed in claim 24, wherein the first and second types are P and N type, respectively, the first and second power supply voltages are a VDD and ground voltage respectively, and the first and second levels are a low and high logic level respectively.

27. The output driver as claimed in claim 22, further comprising an inverter receiving and inverting the data signal.

28. The output driver as claimed in claim 27, wherein the switch circuit comprises:
   a third transistor of the first type, having a drain connected to the gate of the first transistor, a source connected to receive the first power supply voltage, and a gate connected to receive the inverted data signal.

29. The output driver as claimed in claim 28, wherein the first type is an N type the first and second power supply voltages are a ground and VDD voltage respectively, and the first and second levels are a high and low logic level respectively.

30. The output driver as claimed in claim 28, wherein the first type is a P type, the first and second power supply voltages are a VDD and ground voltage, respectively, and the first and second levels are a low and high logic level, respectively.

31. The output driver as claimed in claim 24, wherein the charging/discharging circuit comprises:
   a fifth transistor of a second type, having a drain connected to the charging/discharging node, a source connected to receive the second power supply voltage, and a gate connected to receive the inverted data signal;
   a sixth transistor of the second type, having a source connected to receive the second power supply voltage, a gate connected to receive the inverted data signal, and a drain; and
   a seventh transistor of the second type, having a source connected to the drain of the sixth transistor, and a drain and gate both connected to the charging/discharging node.

32. The output driver as claimed in claim 31, wherein the first and second type is N and P type respectively, the first and second power supply voltage are a ground and VDD voltage respectively, and the first and second level is a high and low logic level respectively.

33. The output driver as claimed in claim 31, wherein the first and second types are P and N type, respectively, the first and second power supply voltages are a VDD and ground voltage, respectively, and the first and second levels are a low and high logic level, respectively.

34. The output driver as claimed in claim 22, wherein the first transistor has a parasitic capacitor between the gate and source.

35. The output driver as claimed in claim 22, wherein the switch circuit comprises:
   an inverter receiving and inverting the data signal;
   a second transistor of a second type, having a source connected to the charging/discharging node, a drain connected to the gate of the first transistor, and a gate connected to receive the the inverted data signal;
   a third transistor of the first type, having a drain connected to the gate of the first transistor, a source connected to receive the first power supply voltage, and a gate connected to receive the inverted data signal; and
   a fourth transistor of the second type, having a source connected to receive the second power supply voltage, a drain connected to the charging/discharging node, and a gate connected to receive the data signal.

36. The output driver as claimed in claim 35, wherein the first and second types are N and P type, respectively, the first and second power supply voltage are a ground and VDD voltage respectively, and the first and second level is a high and low logic level respectively.

37. The output driver as claimed in claim 35, wherein the first and second types are P and N type, respectively, the first and second power supply voltages are a VDD and ground voltage respectively, and the first and second levels are a low and high logic level respectively.

* * * * *